United States Patent
Hung et al.

(10) Patent No.: US 7,944,707 B2
(45) Date of Patent: May 17, 2011

(54) PACKAGE STRUCTURE FOR CONNECTION WITH OUTPUT/INPUT MODULE

(75) Inventors: Chih-pin Hung, Kaohsiung (TW); Ying-te Ou, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 472 days.

(21) Appl. No.: 12/030,565

(22) Filed: Feb. 13, 2008

(65) Prior Publication Data
US 2008/0218981 A1 Sep. 11, 2008

(30) Foreign Application Priority Data
Feb. 14, 2007 (TW) .............................. 96105525 A

(51) Int. Cl.
*H05K 1/18* (2006.01)

(52) U.S. Cl. .......................... 361/762; 174/260

(58) Field of Classification Search .................. 361/728, 361/762; 439/55, 69; 257/678, 701; 174/260
See application file for complete search history.

(56) References Cited

U.S. PATENT DOCUMENTS

| | | | |
|---|---|---|---|
| 6,262,476 B1* | 7/2001 | Vidal | 257/686 |
| 6,833,610 B2* | 12/2004 | Hung | 257/678 |
| 2006/0091529 A1* | 5/2006 | Wehrly et al. | 257/706 |
| 2007/0037440 A1* | 2/2007 | Uchida et al. | 439/495 |
| 2007/0246254 A1* | 10/2007 | Kumar et al. | 174/264 |
| 2008/0167173 A1* | 7/2008 | Lima et al. | 501/80 |
| 2010/0073887 A1* | 3/2010 | Takeguchi et al. | 361/749 |
| 2010/0075080 A1* | 3/2010 | Martin | 428/35.6 |

\* cited by examiner

*Primary Examiner* — Yuriy Semenenko
(74) *Attorney, Agent, or Firm* — Tim Tingkang Xia; Morris, Manning & Martin, LLP

(57) ABSTRACT

A package structure for connection with an output/input module is disclosed. The package structure can be applied to conventional multi-chip packages and system in packages. The package structure defines at least one insertion cavity that is vertically or horizontally disposed. By simply inserting an output/input module into the insertion cavity, an electrical connection can be established between the output/input module and the package structure. Accordingly, the package structure thus constructed can address the repairing, replacement and upgrading problems of electronic components encountered by a package structure that adopts the conventional soldering connection method.

18 Claims, 12 Drawing Sheets

PACKAGE STRUCTURE FOR CONNECTION WITH OUTPUT/INPUT MODULE

BACKGROUND OF THE INVENTION

1. Field of the Invention

The present invention relates to a package structure for connection with an output/input module, and particularly to a package structure that allows easy replacement of an output/input module connected therewith.

2. Description of Prior Art

In the current electronic industry, electronic components such as multi-chip packages and system in packages (SIPs) are generally fixed on a substrate and electrically connected to metal traces on the substrate by a lead frame and a plurality of solder bumps. Under the demands for light, thin, short, small and high performance electronic products, the electronic components in these electronic products and the contact pins thereof are both increased in number and reduced in size.

The solder bumps play an important role since they are responsible for the transmission of electrical signals. Once the solder bumps are damaged, the electronic components may be damaged and thus the entire electronic component may fail in function. Damage of the solder bumps is generally due to thermal fatigue when they are subjected to high temperature variations. It is well known that a package structure consists of several parts among which the solder bumps are the ones that are located at the connection interfaces of the package structure. When subjected to high temperature variations, the solder bumps induce a significant amount of thermal stress therein. This thermal stress causes the solder bumps to crack and peel, leading to failure of the package structure. The lower the height of the solder bumps, the greater the thermal fatigue damage to the solder bumps. Accordingly, for a light, thin, short, small and high performance package structure, the life span of such a package structure is directly impacted by the solder bumps.

In case that such problems occur, it is necessary to repair or replace the electronic components that are damaged due to the damage of the solder bumps, so that the normal operation of the electronic product containing these components can be maintained. Since these electronic components are generally reflow soldered by conventional reheating techniques to securely and electrically affix the components to a circuit board, rework of the solder joints must be performed when repairing or replacement of the electronic components is required. However, in some situations, such as for a flip-chip package or a three-dimensional package, reworkability is generally not available. For a flip-chip package, the underfills thereof that are mainly epoxy-based materials are not reworkable after curing. Three-dimensional (3D) packages, which are one kind of SiP (System in Package) packages, are characterized in reduced package volume and initial system integration. However, most of current 3D package architectures are not reworkable.

In the development stage of electronic products, various experiments and testing procedures must be conducted. Currently, electronic components of the electronic products are first mounted on a substrate by the conventional soldering technology, and then testing is carried out to check whether the function of the electronic product is satisfactory. If the tested electronic product is unsatisfactory in performance or fails in function, electronic components of the tested product that are found to be not properly functioning must be replaced. However, after the replacement and rework of these electronic components, the reliability of the electronic product may be impaired and even the function of the electronic product may be adversely affected.

Hence, an improved package structure is desired to address the repair, replacement and updating problems of electronic components thereof that are encountered in the prior art.

SUMMARY OF THE INVENTION

An object of the present invention is to provide a package structure that allows easy replacement of an output/input module connected therewith.

To achieve the above object, the present invention provides a package structure for connection with an output/input module, comprising at least one substrate, at least one insertion cavity and a plurality of contacts. The substrate has metal traces formed thereon for transmitting electrical signals. Each insertion cavity is substantially a portion of the substrate, and has an opening defined in one surface of the substrate for allowing insertion of the output/input module. The contacts are formed on inner walls of the insertion cavity for electrical connection with corresponding contacts on the output/input module.

Each of the contacts has a roughened surface formed by roughing treatment for enhancing reliability of electrical connection between the contact and a corresponding contact of the output/input module. An anti-wear layer is further formed on the roughened surface.

The package structure of the present invention further comprises at least one dielectric layer arranged between confronting surfaces of opposing substrates.

The package structure constructed according to the present invention effectively avoids discarding of the entire package structure in case of damage of electronic components thereof, and also avoids replacement of the entire package structure when upgrading of some electronic components thereof is required.

BRIEF DESCRIPTION OF THE DRAWINGS

The present invention may be best understood through the following description with reference to the accompanying drawings, in which.

DETAILED DESCRIPTION OF THE PREFERRED EMBODIMENTS

Figure 1A:
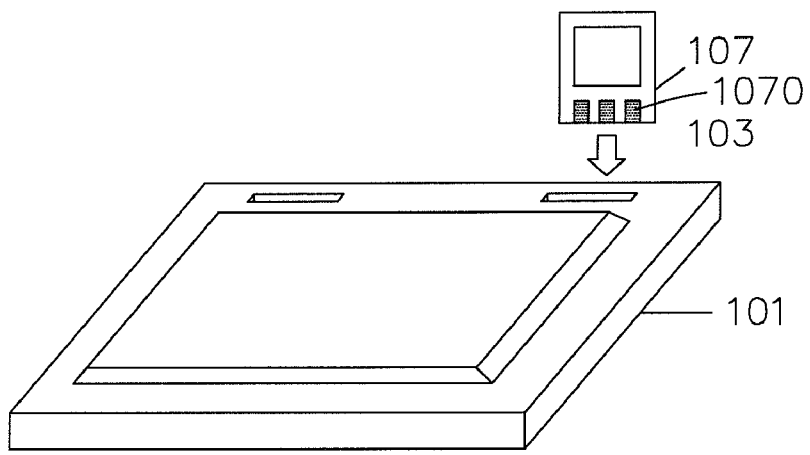
FIGS. 1A to 1C are schematic views showing three different configurations of an insertion cavity of the package structure of the present invention for electrically receiving an output/input module therein.
Figure 1B:
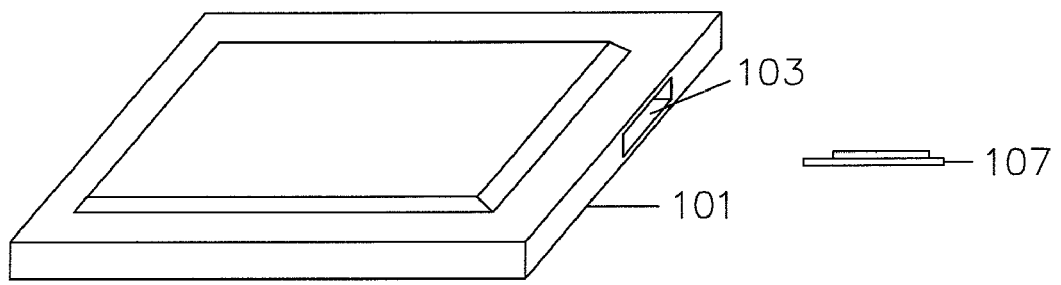
Figure 1C:
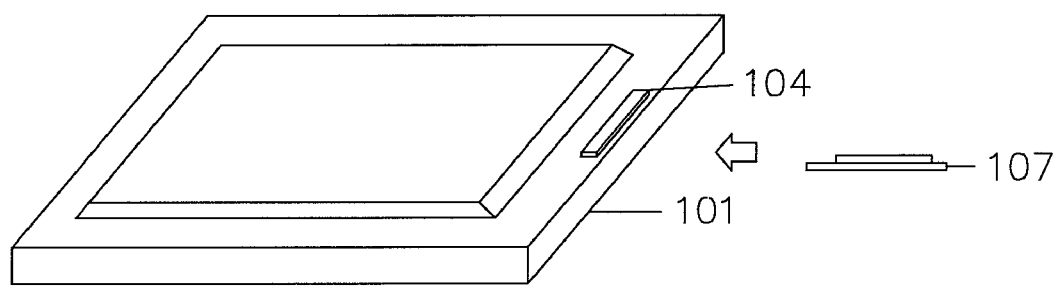

With reference to the drawings and in particular to FIGS. 1A to 1C, which schematically and respectively show package structures in accordance with different embodiments of the present invention, all designated with the same reference numeral 101 for simplicity, and each forming one or more insertion cavities broadly designated at 103 functioning to electrically and releasably receive an output/input module 107 therein. As shown in the drawings, each of the package structures 101 in accordance with the present invention defines at least one insertion cavity 103 for receiving and establishing electrical connection with an output/input module 107. The insertion cavity 103 has an opening defined in one surface of the package structure 101 for allowing insertion of the output/input module 107.

In the embodiment of FIG. 1A, the package structure 101 has two insertion cavities 103 vertically defined in an upper surface thereof. An output/input module 107 can be selectively inserted into either one or both of the insertion cavities 103 in a vertical direction as indicated by the arrow shown in FIG. 1A. FIG. 1B illustrates another embodiment, in which the package structure 101 has only one insertion cavity 103 horizontally defined in one side surface thereof. An output/input module 107 can be selectively inserted into the insertion cavity 103 in a horizontal direction. FIG. 1C illustrates a further embodiment of the present invention, in which the package structure 101 forms an insertion port 104 on an upper surface thereof with the opening of the insertion port 104 facing sideways so that an output/input module 107 can be selectively inserted into the insertion port 104 in a horizontal direction as indicated by the arrow shown in FIG. 1C. The insertion port 104 in FIG. 1C is different from those in FIGS. 1A and 1B in that it is in the form of a bus slot.

Each insertion cavity 103 and insertion port 104 shown in FIGS. 1A to 1C has a plurality of inelastic but electrically conductive contacts formed on inner walls thereof. Each contact is made of an electrically conductive metal material for electrical connection with corresponding contacts on the output/input module 107. Detailed description of the contacts will be provided below.

Figure 2A:
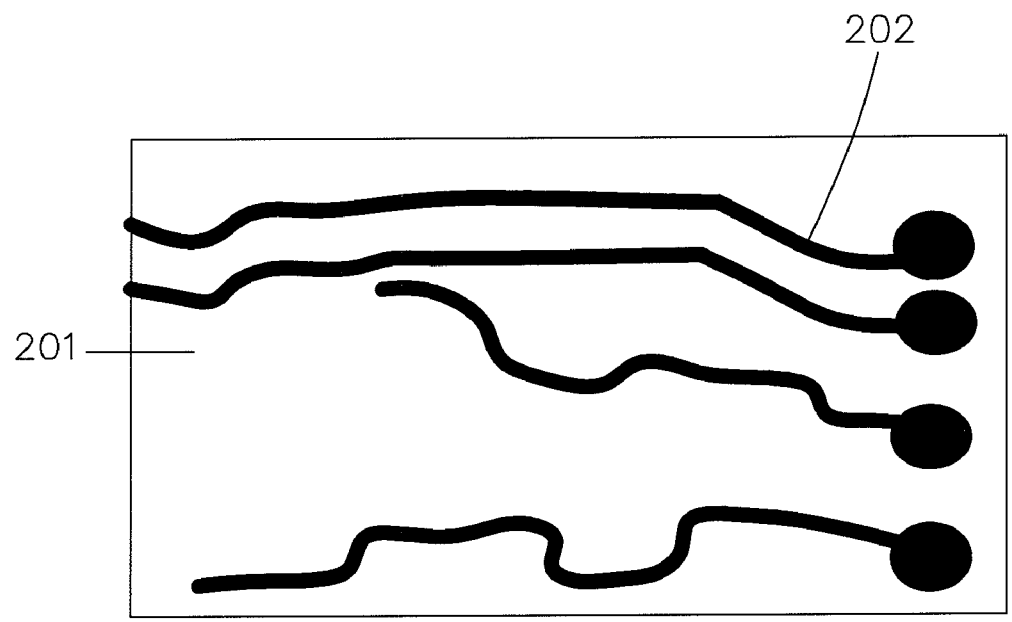
FIGS. 2A to 2H sequentially show the production steps of a package structure according to the first embodiment of the present invention, which allows an output/input module to be inserted therein in a vertical direction.
Figure 2B:
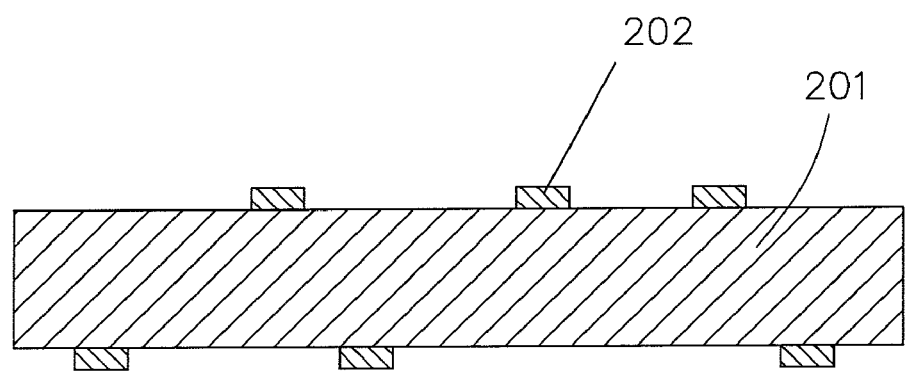

FIGS. 2A to 2H sequentially show the production steps of the package structure corresponding to an embodiment of the present invention shown in FIG. 1A, which allows an output/input module to be inserted therein in a vertical direction. A substrate 201 is first provided as shown in FIGS. 2A and 2B, which are respectively a top view and a cross-sectional side elevational view of the substrate 201. The substrate 201 has a plurality of metal or conductive traces 202 formed thereon for transmitting electrical signals. In the embodiment illustrated, the metal traces 202 are formed on opposite upper and lower surfaces of the substrate 201 by conventional methods including plating, exposure, etching and laser drilling, but not including application of a solder mask to the substrate 201. Preferably, the conductive traces 202 are made of a hard gold material that is resistant to abrasion and high in conductivity.

Figure 2C:
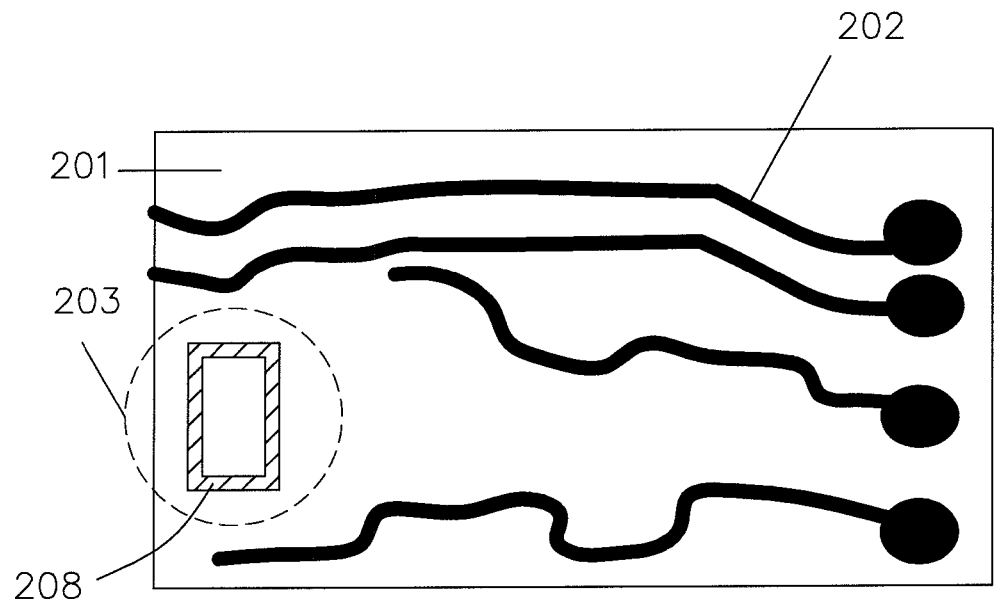
Figure 2D:
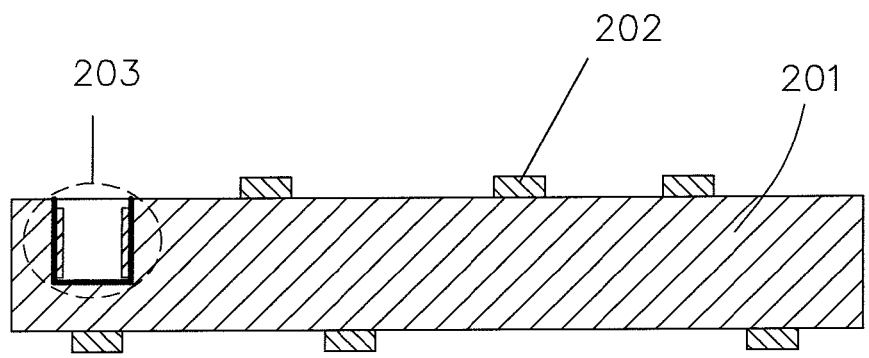

FIGS. 2C and 2D illustrate the second step of the production process of the package structure and FIG. 2C is a top view of the substrate 201 and FIG. 2D is a cross-sectional side view of FIG. 2C. An insertion cavity 203 is defined in the upper surface of the substrate 201 at a desired location by etching, and a conductive material, for example metal, such as hard gold, is plated on inner walls of the insertion cavity 203 to form an electrical conductive layer 208. The insertion cavity 203 has an opening defined in the upper surface of the substrate 201 for allowing vertical insertion of an output/input module. As clearly shown in FIG. 2C, the insertion cavity 203 is elongated in a direction perpendicular to the extending direction of the metal traces 202 on the substrate 201.

Figure 2E:
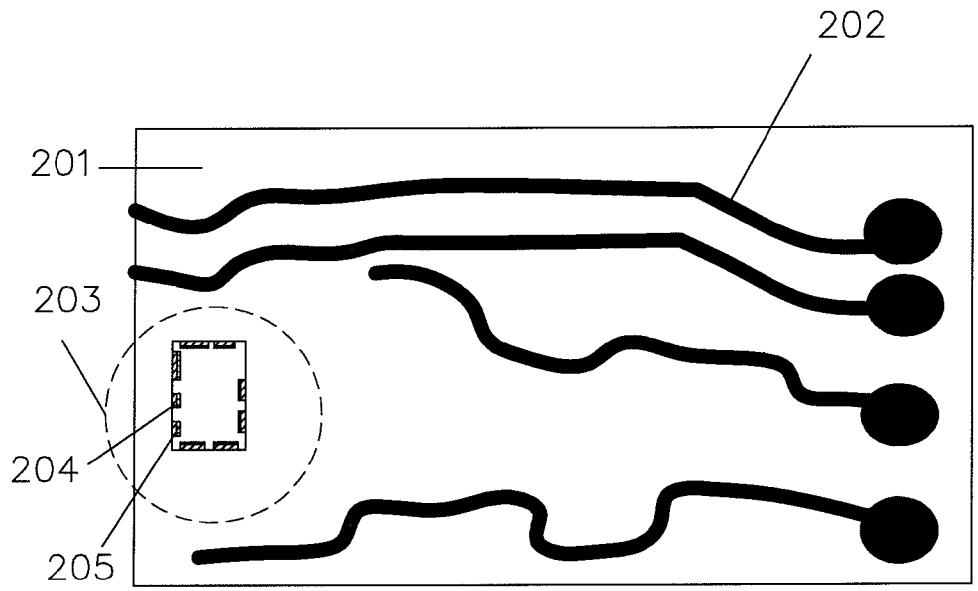
Figure 2F:
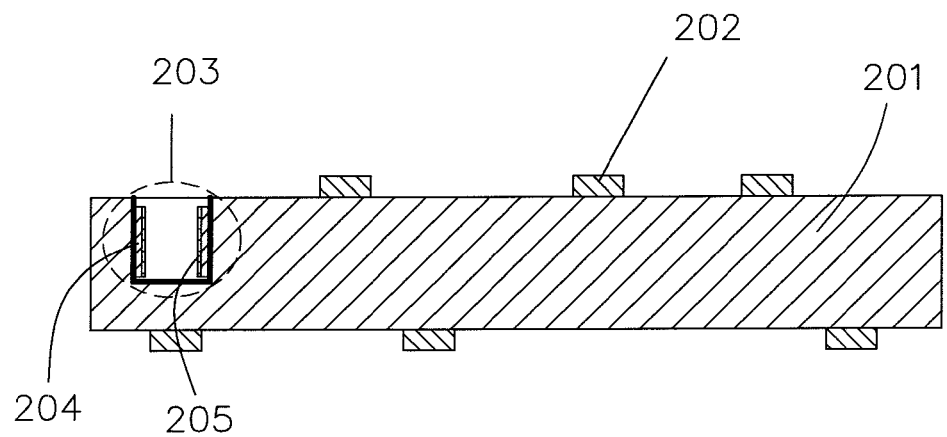

FIGS. 2E and 2F illustrate the third step of the production process of the package structure and FIG. 2E is a top view of the substrate 201 and FIG. 2F is a cross-sectional side view of FIG. 2E. As shown in FIG. 2E, undesired portions of the electrical conductive layer 208 are removed by laser etching or other known means to thereby form a plurality of electrical conductive contacts 204 on the inner walls of the insertion cavity 203. It is understandable that since these contacts 204 are formed by first subjecting the inner walls of the insertion cavity 23 to plating of conductive material to form the electrical conductive layer 208, followed by removing the undesired portions from the electrical conductive layer 208 by means of laser etching or other known means, these contacts 204 are generally inelastic. Each contact 204 is then subjected to roughing treatment to form a roughened surface so as to enhance the reliability of electrical connection between the contact 204 and a corresponding contact 2070 of the output/input module 207 (FIG. 2H). As shown in FIG. 2F, an anti-wear layer 205 is further plated on each contact 204 after the roughening treatment.

Figure 2G:
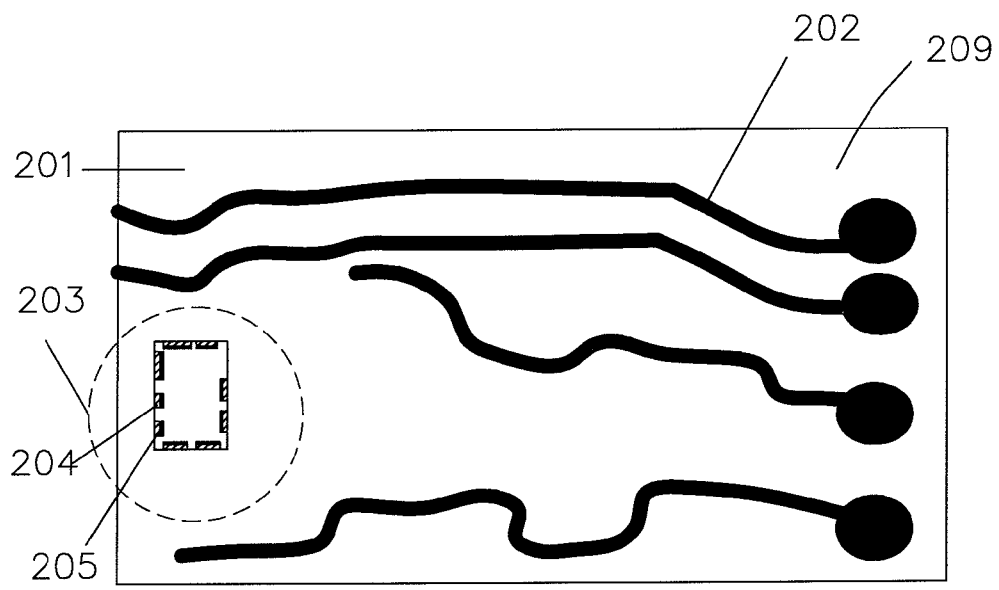
Figure 2H:
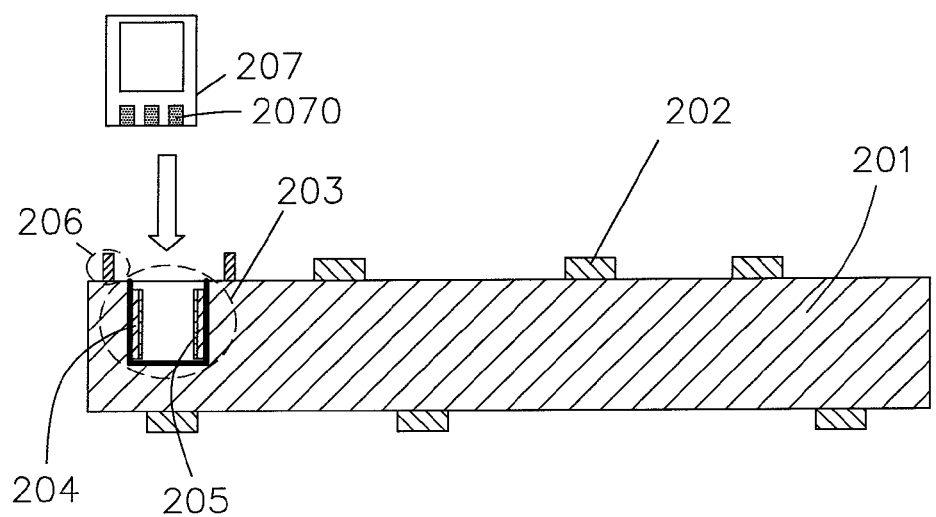

FIGS. 2G and 2H illustrate the final step of the production process of the package structure and FIG. 2G is a top view of the substrate 201 and FIG. 2H is a cross-sectional side view of FIG. 2G. As shown in FIGS. 2G and 2H, a solder mask layer 209 is provided on the substrate 201. A plurality of guiding and retaining structures 206 is further disposed around the periphery of the insertion cavity 203 for guiding the insertion of the output/input module 207 and retaining the inserted output/input module 207 in position, so that damage to the output/input module 207 caused by external impact forces can be prevented.

Figure 3:
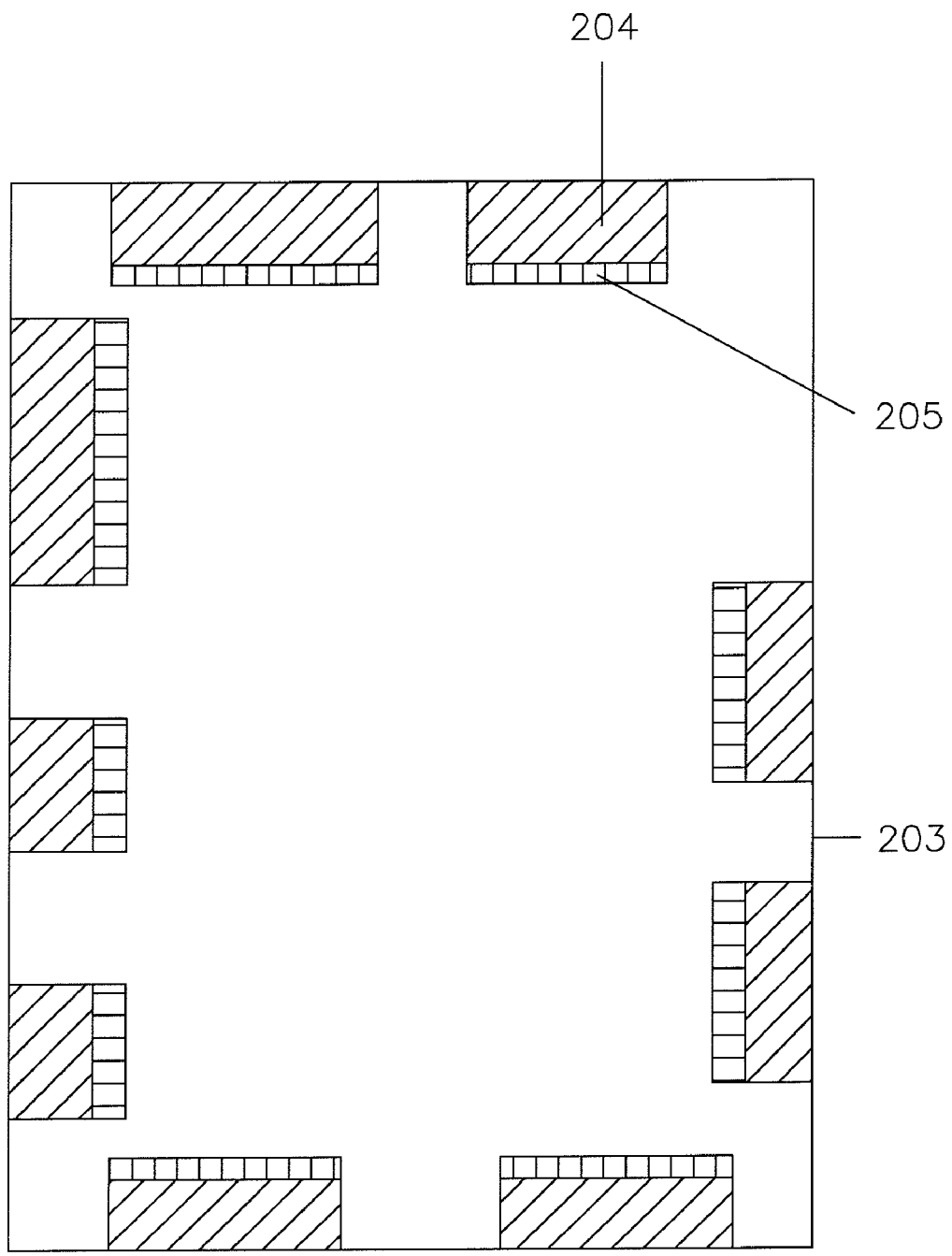
FIG. 3 is a horizontal cross-sectional view showing the configuration of an insertion cavity of the package structure according to the first embodiment of the present invention.

FIG. 3 is a horizontal cross-sectional view showing the configuration of an insertion cavity 203 of the package structure according to the present invention. As described above, the insertion cavity 203 is first plated with a conductive metal material on the inner walls thereof to form the electrical conductive layer 208, and the undesired portions of the electrical conductive layer 208 are then removed by laser etching to thereby form the plurality of electrical conductive contacts 204 on the inner walls of the insertion cavity 203. Therefore, the thus formed insertion cavity 203 is capable to form electrical connection with various insertable electronic devices, rather than just a specific output/input module 207 exemplified herein, and has high compatibility with various output/input modules 207.

Figure 4A:
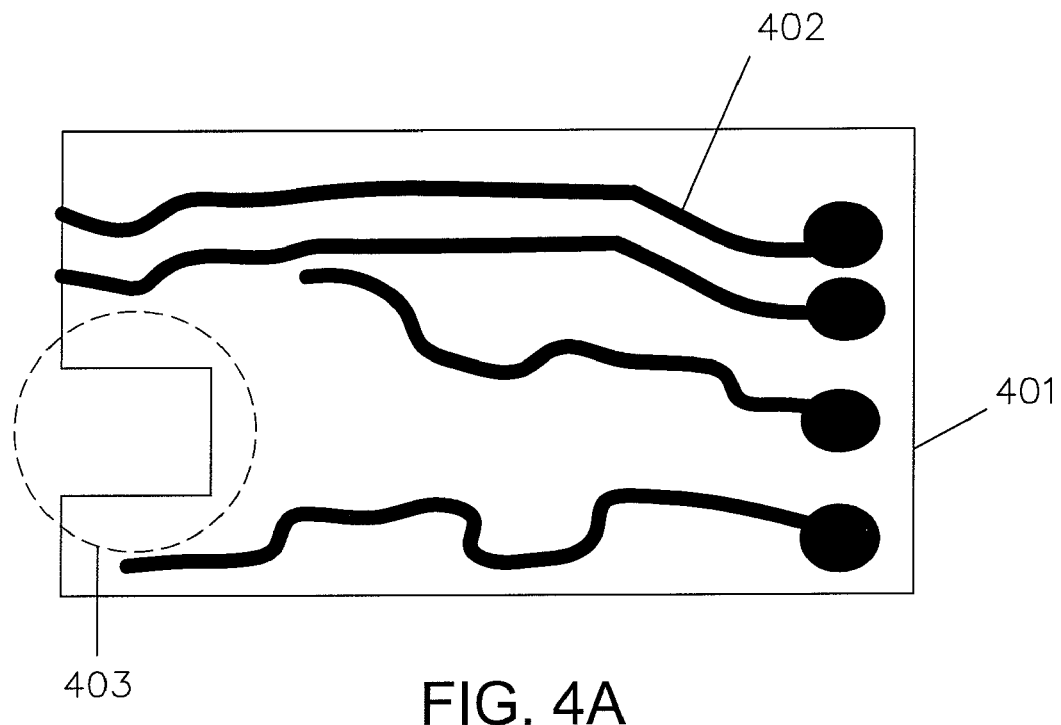
FIGS. 4A to 4H sequentially show the production steps of a package structure according to the second embodiment of the present invention, which allows an output/input module to be inserted therein in a horizontal direction.
Figure 4B:
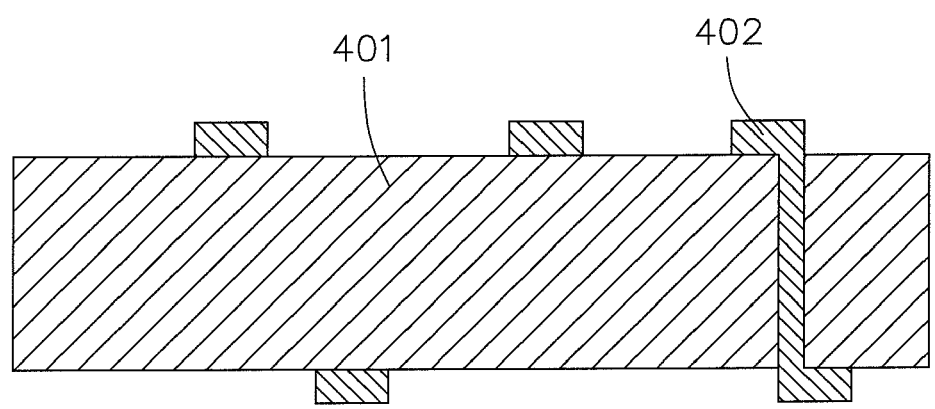

FIGS. 4A to 4H sequentially show the production steps of a package structure according to another embodiment of the present invention, which allows an output/input module to be inserted therein in a horizontal direction. A first substrate 401 is provided first, as shown in FIGS. 4A and 4B, which are respectively a top view and a cross-sectional side elevational view of the first substrate 401. The first substrate 401 has a plurality of metal or conductive traces 402 formed thereon for transmitting electrical signals. These metal traces 402 are formed on opposite upper and lower surfaces of the first substrate 401 by conventional methods including plating, exposure, etching and laser drilling, but not including application of a solder mask to the substrate 401. As shown in FIG. 4B, the metal traces 402 formed on opposite upper and lower surfaces of the first substrate 401 are electrically connected with each other using PTH (Plated Through Hole) technology. Preferably, the metal traces 402 are made of hard gold for the superior characteristics of the hard gold in resisting abrasion and having excellent conductivity.

As shown in FIG. 4A, a first cutout corresponding to a desired final insertion cavity 403 as circled in the drawing is defined in a side edge of the first substrate 401 at a desired location by etching or other known and suitable means. The first cutout corresponding to the insertion cavity 403 has an opening defined in the side edge of the first substrate 401 for allowing horizontal insertion of an output/input module. As clearly shown in FIG. 4A, the first cutout is elongated in a direction parallel to the extending direction of the metal traces 402 on the first substrate 401.

Figure 4C:
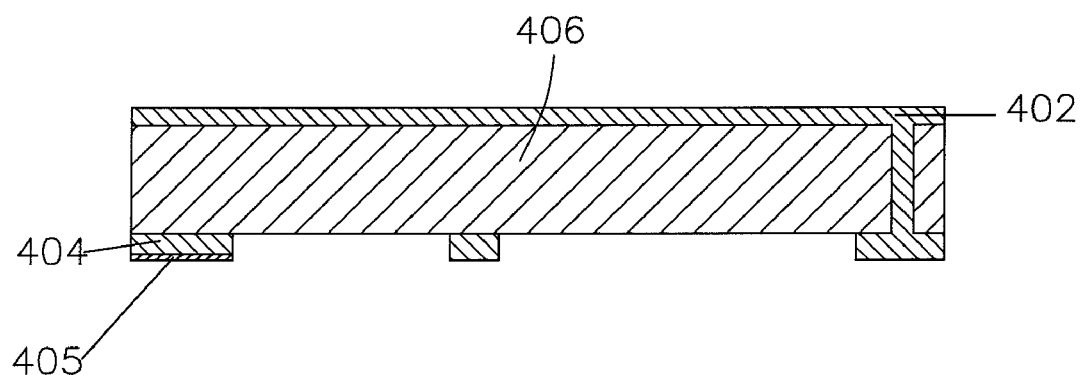

FIG. 4C illustrates the second step of the production process of the package structure. At this step, a second substrate or an upper board 406 is further provided. Similar to the first substrate 401, the upper board 406 has a plurality of metal traces 402 formed on opposite upper and lower surfaces thereof for transmitting electrical signals. What is different is that these metal traces 402 are formed on the upper board 406 by conventional methods including plating, exposure, etching and laser drilling, and also including a step of applying a solder mask. The metal traces 402 formed on the upper and lower surfaces of the upper board 406 are also electrically connected with each other using PTH technology. A conductive metal material, such as copper, silver or gold, is then plated on the lower surface of the upper board 406 at a location corresponding to the cutout defined in the side edge of the first substrate 401 so as to form an electrical conductive layer. Undesired portions of this electrical conductive layer are removed by laser etching to thereby form a plurality of electrical conductive contacts 404. It is understandable that since these contacts 404 are formed by first plating the lower surface of the upper board 406 at a location corresponding to the cutout defined in the side edge of the first substrate 401 to form an electrical conductive layer and then removing the undesired portions of the electrical conductive layer by means of laser etching, these contacts 404 are generally inelastic. Each contact 404 is then subjected to roughing treatment to form a roughened surface so as to enhance the reliability of electrical connection between the contact 404 and a corresponding contact 4070 of the output/input module 407 (FIG. 4H). An anti-wear layer 405 is further plated on each contact 404 after the roughening treatment.

Figure 4D:
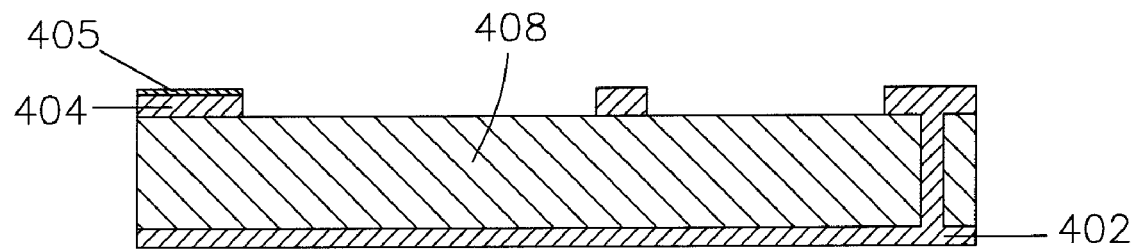

FIG. 4D illustrates the third step of the production process of a package structure according to the second embodiment of the present invention. At this third step, a third substrate or a lower board 408 is further provided. Similar to the first substrate 401, the lower board 408 also has a plurality of metal traces 402 formed on opposite upper and lower surfaces thereof for transmitting electrical signals. What is different is that these metal traces 402 are formed on the lower board 408 by conventional methods including plating, exposure, etching and laser drilling, and also including the step of applying a solder mask. The metal traces 402 formed on opposite upper and lower surfaces of the lower board 408 are also electrically connected with each other using PTH technology. A conductive material, for example metal, such as copper, silver or gold, is then plated on the upper surface of the lower board 408 at a location corresponding to the cutout defined in the side edge of the first substrate 401 so as to form an electrical conductive layer. Undesired portions of this electrical conductive layer are removed by laser etching to thereby form a plurality of electrical conductive contacts 404. It is understandable that, since these contacts 404 are formed by first plating the upper surface of the lower board 408 at a location corresponding to the first cutout defined in the side edge of the first substrate 401 to form an electrical conductive layer and then removing undesired portions of the electrical conductive layer by means of laser etching, they are generally inelastic. Each contact 404 is then subjected to a roughing treatment to form a roughened surface thereon, so as to enhance the reliability of electrical connection between the contact 404 and a corresponding contact 4070 on the output/input module 407 (FIG. 4H). An anti-wear layer 405 is further plated on each contact 404 after the roughening treatment.

Although it is described in the above embodiment that the first substrate 401, the upper board 406 and the lower board 408 are manufactured in successive order, it is noted that the present invention is not so limited. The first substrate 401, the upper board 406 and the lower board 408 can also be manufactured in other orders.

Figure 4E:
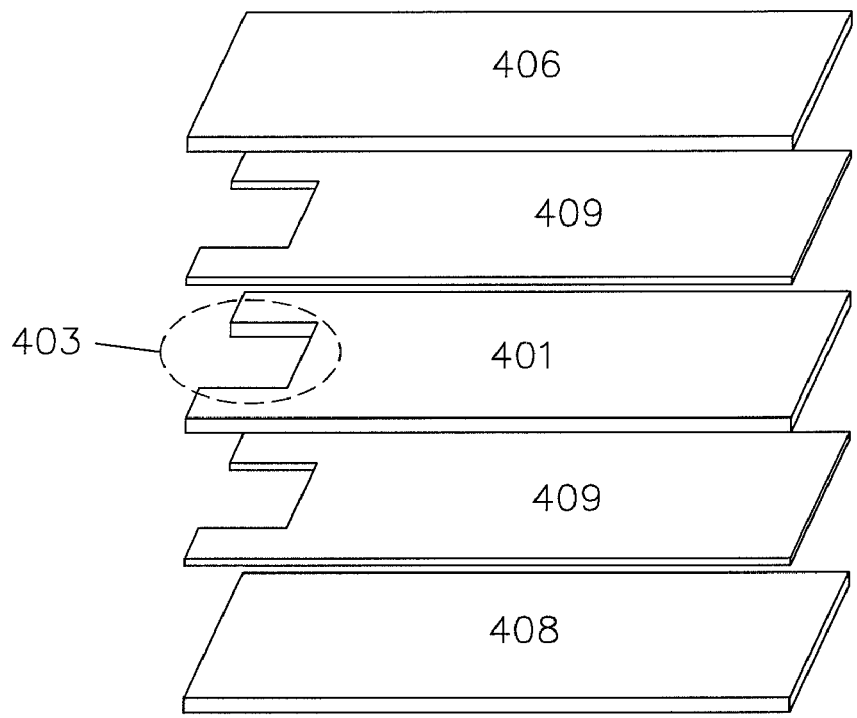
Figure 4F:
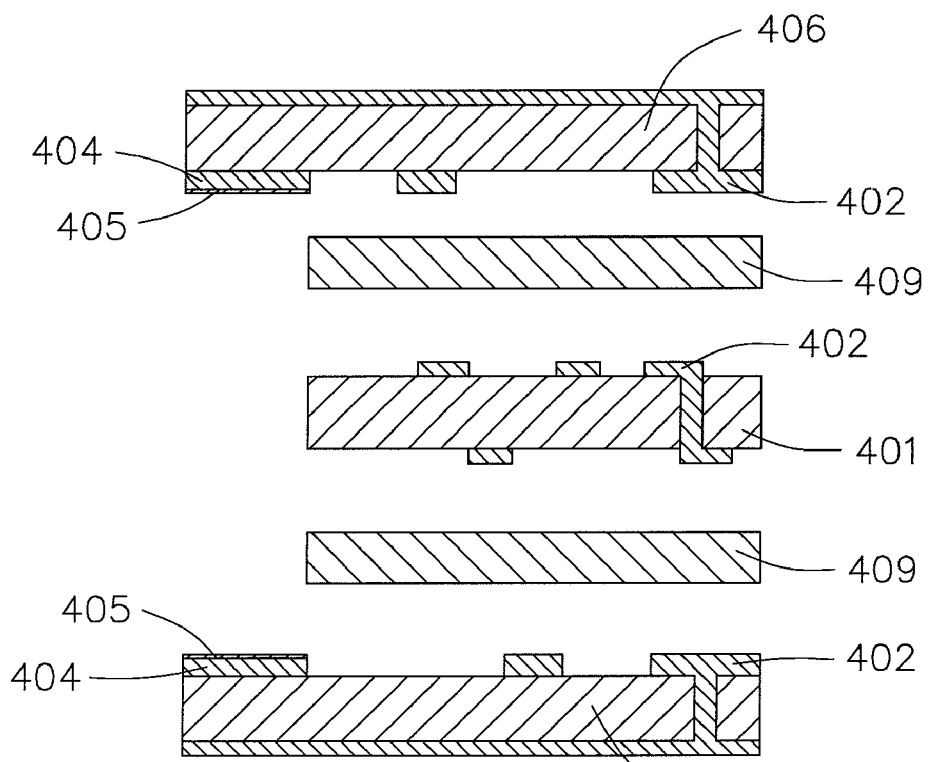

FIGS. 4E and 4F illustrate the fourth step of the production process of the package structure and FIG. 4E is a top view illustrating the constituent components of the package structure of the embodiment and FIG. 4F is a cross-sectional side view of FIG. 4E. As shown in FIG. 4E, upper and lower dielectric layers 409 are further provided, and are respectively sandwiched between the upper board 406, the first substrate 401 and the lower board 408. Each dielectric layer 409 is preferably made of ceramic or silicon dioxide to reduce the leakage current and avoid decrease of the driving voltage. A cutout is defined in one side edge of each dielectric layer 409 by etching, and is aligned with the first cutout of the first substrate 401. The upper board 406, the upper dielectric layer 409, the first substrate 401, the lower dielectric layer 409 and the lower board 408 are then laminated with each other to form a package structure as shown in FIG. 4G.

Figure 4G:
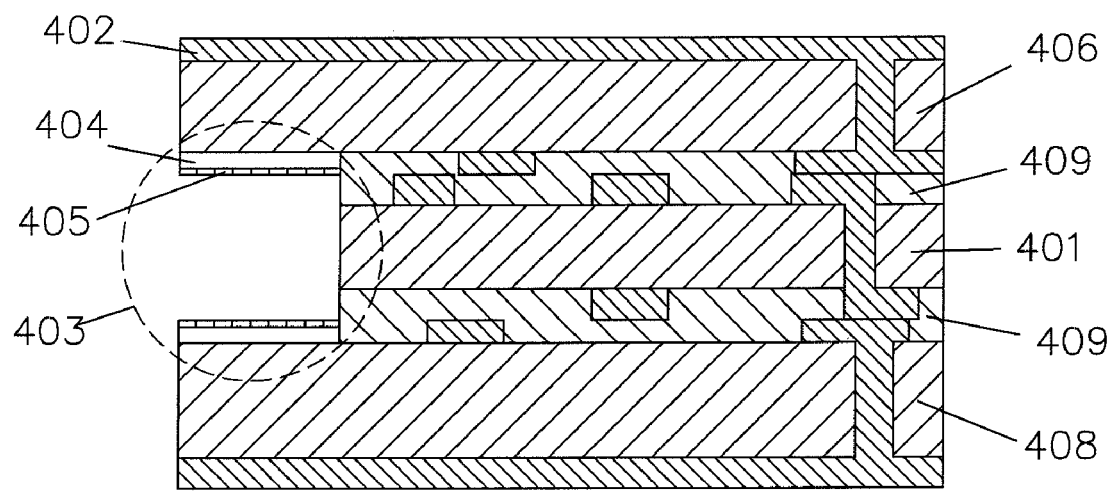
Figure 4H:
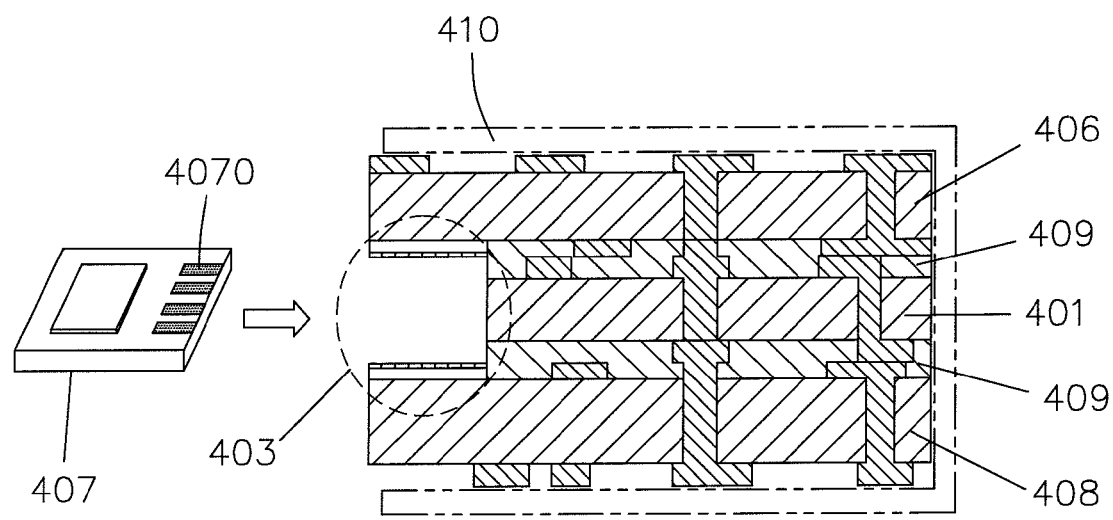

Referring to FIG. 4G, the package structure constructed in accordance with the embodiment is shown. As described above, this package structure is obtained by laminating the upper board 406, the upper dielectric layer 409, the first substrate 401, the lower dielectric layer 409 and the lower board 408. A desired final insertion cavity 403 for receiving the output/input module 407 is also formed by lamination of these components, which is corresponding to those cutouts defined in the side edges of the first substrate 401 and the two dielectric layers 409. As shown, the insertion cavity 403 thus formed has a plurality of inelastic but electrically conductive contacts 404 on the top and the bottom thereof. Each contact 404 has a roughened surface formed by roughing treatment for enhancing the reliability of electrical connection between the contact 404 and a corresponding contact 4070 of the output/input module 407. An anti-wear layer 405 is further formed on the roughened surface of each contact 404.

Referring to FIG. 4H, after lamination, the upper board 406, the first substrate 401 and the lower board 408 are electrically connected with each other by interconnection of the metal traces 402 thereof using the PTH technology. In order to reliably retain the constituent components of the package structure in position, a reinforcing member 410 is further disposed around a periphery of the package structure. This reinforcing member 410 can be in the form of a reinforcing strip, a reinforcing clip or a metal ring or other suitable devices.

As described above, by defining an insertion cavity to receive an output/input module and thus establishing an electrical connection therebetween, the package structure constructed according to the present invention effectively avoids discarding of the entire package structure in case of damage of the output/input module, and also avoids replacement of the entire package structure when attempting to upgrade one of a number of output/input modules connected to the package is required. Therefore, the package structure constructed in accordance with the present invention addresses the problems associated with repairing, replacement and upgrading of electronic components encountered by a package structure that adopts the conventional soldering connection method.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A package structure for connection with an output/input module, comprising:
   at least one substrate having metal traces formed thereon for transmitting electrical signals;
   at least one insertion cavity, said insertion cavity being substantially a portion of said substrate and having an opening defined in one surface of said substrate for allowing insertion of the output/input module;
   a plurality of contacts made of an electrically conductive metal material, the contacts being formed on inner walls of said insertion cavity for directly electrical connection with corresponding contacts of the output/input module; and
   a guiding and retaining structure formed around each of said insertion cavity of said substrate for guiding insertion of the output/input module into said insertion cavity through the opening.

2. The package structure as claimed in claim 1, wherein the contacts are inelastic and are electrically conductive.

3. The package structure as claimed in claim 2, wherein each of the contacts has a roughened surface formed by roughing treatment and an anti-wear layer formed on the roughened surface.

4. The package structure as claimed in claim 1, wherein said insertion cavity is formed on said substrate by etching, and the contacts are formed by first plating the electrically conductive metal material on the inner walls of said insertion cavity and then removing undesired portions by a drilling process.

5. The package structure as claimed in claim 4, wherein the electrically conductive metal material is selected from a group consisting of copper, silver and gold.

6. The package structure as claimed in claim 4, wherein the drilling process is performed by laser drilling.

7. The package structure as claimed in claim 1, wherein the opening of said insertion cavity is elongated in a direction perpendicular to the extending direction of the metal traces on said substrate.

8. The package structure as claimed in claim 1, wherein the opening of said insertion cavity is elongated in a direction parallel to the extending direction of the metal traces on said substrate.

9. The package structure as claimed in claim 8 further comprising a reinforcing member disposed around a periphery of the package structure for reliably retaining said substrate.

10. The package structure as claimed in claim 9, wherein the reinforcing member is a reinforcing strip, a reinforcing clip or a metal ring.

11. A package structure for connection with an output/input module, comprising:
   at least two substrates each having metal traces formed thereon for transmitting electrical signals;
   at least one dielectric layer arranged between confronting surfaces of opposing substrates;
   at least one insertion cavity defined among said substrates for allowing insertion of the output/input module;
   a plurality of contacts made of an electrically conductive metal material, the contacts being formed on inner walls of said insertion cavity for directly electrical connection with corresponding contacts of the output/input module; and
   a guiding and retaining structure formed around each of said insertion cavity of said substrates for guiding insertion of the output/input module into said insertion cavity.

12. The package structure as claimed in claim 11, wherein the contacts are inelastic and are electrically conductive.

13. The package structure as claimed in claim 12, wherein each of the contacts has a roughened surface formed by roughing treatment and an anti-wear layer formed on the roughened surface.

14. The package structure as claimed in claim 11, wherein said insertion cavity is formed on at least one substrate by etching, and the contacts are formed by first plating the electrically conductive metal material on the inner walls of said insertion cavity and then removing undesired portions by a drilling process.

15. The package structure as claimed in claim 11, wherein the electrically conductive metal material is selected from a group consisting of copper, silver and gold.

16. The package structure as claimed in claim 11, wherein said substrates and said dielectric layer are set to engage each other by laminating.

17. The package structure as claimed in claim 11 further comprising a reinforcing member disposed around a periphery of the package structure for reliably retaining the engagement between said substrates and said dielectric layer.

18. The package structure as claimed in claim 17, wherein the reinforcing member is a reinforcing strip, a reinforcing clip or a metal ring.

* * * * *